(12) United States Patent
Nagashima

(10) Patent No.: US 6,827,973 B2
(45) Date of Patent: Dec. 7, 2004

(54) SUBSTRATE PROCESSING METHOD

(75) Inventor: Shinji Nagashima, Kikuchi-gun (JP)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 10/025,453

(22) Filed: Dec. 26, 2001

(65) Prior Publication Data

US 2002/0045011 A1 Apr. 18, 2002

Related U.S. Application Data

(62) Division of application No. 09/611,664, filed on Jul. 6, 2000, now abandoned.

(30) Foreign Application Priority Data

Jul. 7, 1999 (JP) ............................................ 11-193671

(51) Int. Cl.[7] .............................. B05D 3/12; B05D 1/36
(52) U.S. Cl. ...................... 427/240; 427/299; 427/314; 427/377; 427/385.5; 427/398.1; 427/407.1; 427/422; 427/425; 118/52; 118/59; 118/69; 118/320; 438/763; 438/782
(58) Field of Search ................................ 427/240, 425, 427/422, 407.1, 374.1, 385.5, 299, 314, 377, 379, 398.1; 118/52, 320, 58, 69, 59; 438/763, 780, 782

(56) References Cited

U.S. PATENT DOCUMENTS

| | | | | |
|---|---|---|---|---|
| 4,790,262 A | * | 12/1988 | Nakayama et al. | ............ 118/52 |
| 5,580,607 A | * | 12/1996 | Takekuma et al. | .......... 427/240 |
| 5,762,709 A | * | 6/1998 | Sugimoto et al. | ............. 118/52 |
| 5,942,035 A | | 8/1999 | Hasebe et al. | ................. 118/52 |
| 6,001,417 A | * | 12/1999 | Nunotani et al. | ........... 427/240 |
| 6,004,047 A | * | 12/1999 | Akimoto et al. | ............ 396/604 |
| 6,306,455 B1 | * | 10/2001 | Takamori et al. | ............... 427/8 |
| 6,350,316 B1 | * | 2/2002 | Hayashi et al. | ............... 118/52 |

FOREIGN PATENT DOCUMENTS

JP 11-251311 9/1999

* cited by examiner

Primary Examiner—Kirsten C. Jolley
(74) Attorney, Agent, or Firm—Oblon, Spivak, McClelland, Maier & Neustadt, P.C.

(57) ABSTRACT

After a first processing solution is spread over the front surface of a substrate and the temperature of the front surface of the substrate is regulated at a predetermined substrate temperature, a second processing solution is spread over the front surface of the substrate. The second processing solution can be spread while the front surface temperature of the substrate is maintained at the predetermined substrate temperature. Hence, a layer insulating film with good adhesion properties can be formed uniformly on the front surface of the substrate, and the quantity of the processing solution to be used can be reduced.

1 Claim, 17 Drawing Sheets

SUBSTRATE PROCESSING METHOD

CROSS-REFERENCE TO RELATED APPLICATIONS

This application is a divisional application of, and claims priority to, Ser. No. 09/611,664 filed Jul. 6, 2000, abandoned, and claims priority to Japanese Application No. JP 11-193671 filed Jul. 7, 1999, the entire contents of which are incorporated herein by reference.

BACKGROUND OF THE INVENTION

The present invention relates to a substrate processing method and a substrate processing apparatus, for example, for forming a layer insulating film or the like on a substrate.

In the process of fabricating a semiconductor device, so-called multilayer interconnection in which electrode wiring such as aluminum wiring is formed in multiple layers on the front surface of a substrate such as a semiconductor wafer (hereinafter referred to as "a wafer") is performed. In the multilayer interconnection, a layer insulating film composed of organic macromolecules and the like is formed between the multilayered electrode wiring, whereby insulation properties between the multilayered electrode wiring are secured.

A spin coating method has been hitherto used to form a layer insulating film. In the spin coating method, a coating solution (a coating solution containing organic macromolecules and the like) which is a raw material for a layer insulating film is supplied to the front surface of a wafer and spread over the entire front surface of the wafer by centrifugal force by rotating the wafer. Then, the wafer is spin-dried by being further rotated, and thereby a layer insulating film composed of organic macromolecules and the like is formed on the front surface of the wafer. Thereafter the wafer is subjected to heat processing, for example, at a temperature of 310° C., by stepwise heating over several times, and then to cooling processing.

Incidentally, adhesion promoter (ADP) processing for supplying an ADP solution to the wafer is performed before the coating solution is supplied to the front surface in order to enhance adhesion of the coating solution on the front surface of the wafer, in which case there is a possibility that the front surface temperature of the wafer changes because of the supply of the ADP solution. An excessive drop in the front surface temperature of the wafer because of the performance of the ADP processing, for example, causes drying of the coating solution not to progress, and thus the large quantity of coating solution supplied to the peripheral edge portion of the wafer is cleared off to the surroundings of the wafer by centrifugal force due to the rotation of the wafer. Consequently, the quantity of the coating solution cleared off increases and hence waste increases. Specially in the edge portion of the wafer, a layer insulating film having a sufficient thickness becomes difficult to form. Conversely, an excessive rise in the front surface temperature of the wafer because of the performance of the ADP processing, for example, causes drying of the coating solution to progress excessively, and thus the coating solution does not spread uniformly to the peripheral edge portion of the wafer. As described above, a change in the front surface temperature of the wafer is not favorable since it causes nonuniformity of the layer insulating film. The wafer increases in size these days, and with this increase, harmful effects due to the aforesaid nonuniformity of the layer insulating film and an increase in the quantity of the coating solution to be used become a subject of discussion.

BRIEF SUMMARY OF THE INVENTION

Accordingly, an object of the present invention is to provide a substrate processing method and a substrate processing apparatus each capable of uniformly forming a layer insulating film with a good adhesion on the front surface of a substrate and reducing the quantity of a processing solution to be used.

To settle the aforesaid disadvantages, a first aspect of the present invention is a substrate processing method, comprising the steps of: spreading a first processing solution over the front surface of a substrate; regulating the temperature of the front surface of the substrate over which the first processing solution is spread at a predetermined substrate temperature; and spreading a second processing solution over the front surface of the substrate of which the temperature is regulated at the predetermined temperature.

In the present invention, after the first processing solution is spread over the front surface of the substrate, the temperature of the front surface of the substrate is regulated at the predetermined substrate temperature. Consequently, the second processing solution can be spread while the front surface temperature of the substrate is maintained at the predetermined substrate temperature.

A second aspect of the present invention is a substrate processing apparatus, comprising: a first processing solution supply nozzle for supplying a first processing solution to the front surface of a substrate; a second processing solution supply nozzle for supplying a second processing solution to the front surface of the substrate; a rotary mounting table for mounting the substrate thereon and rotating the substrate; and a temperature regulating mechanism for regulating the temperature of the front surface of the substrate at a predetermined substrate temperature.

These objects and still other objects and advantages of the present invention will become apparent upon reading the following specification when taken in conjunction with the accompanying drawings.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
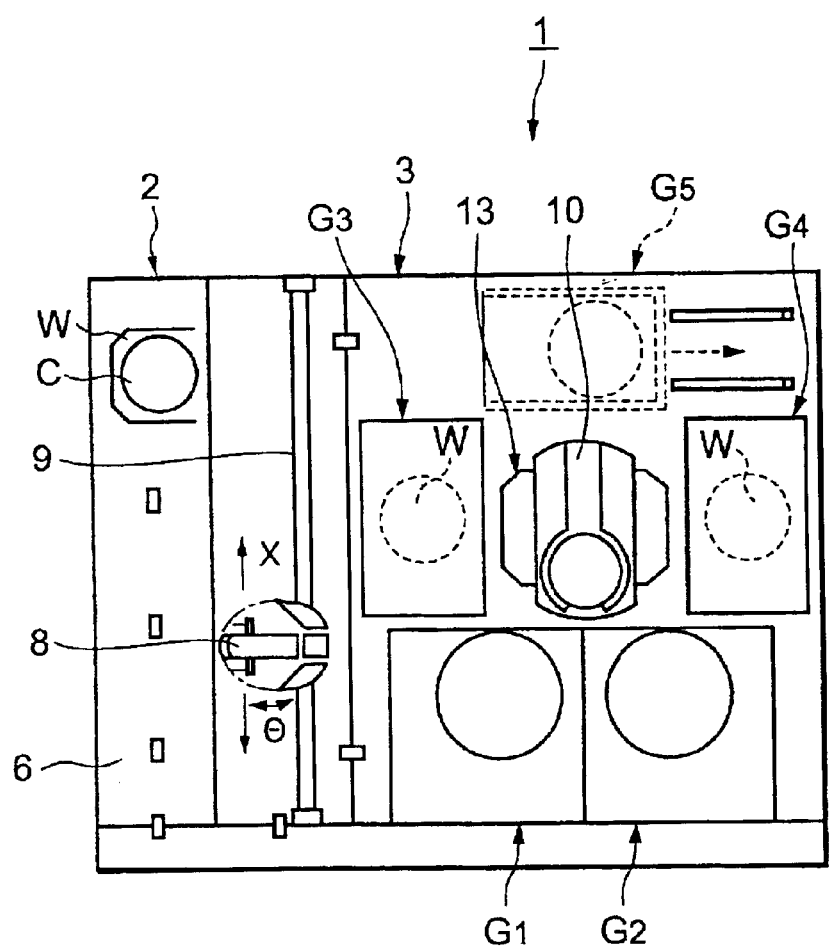
FIG. 1 is a plane view of a film forming system in which a film forming method according to an embodiment of the present invention is put into practice.
Figure 2:
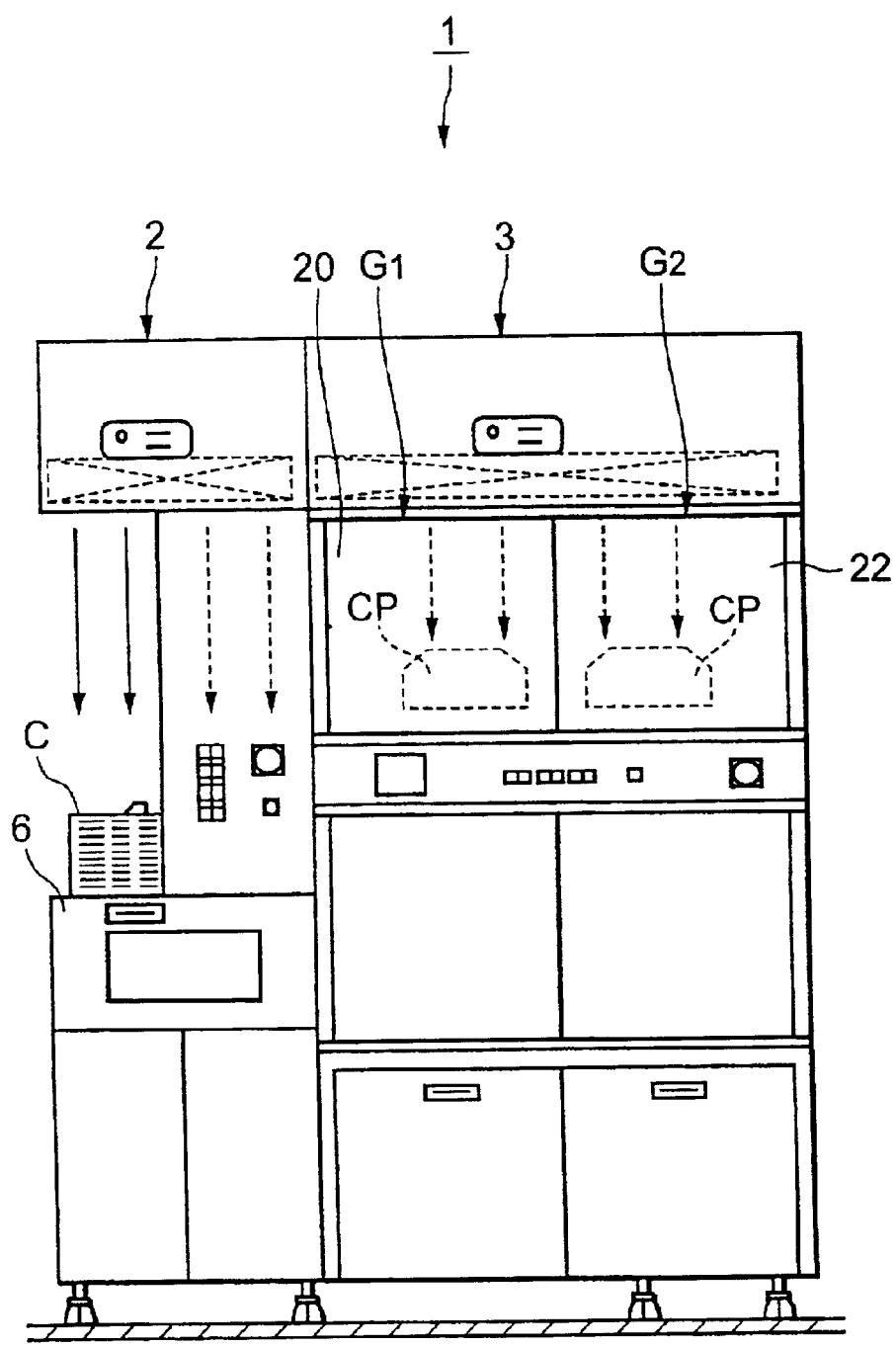
FIG. 2 is a front view of the film forming system in FIG. 1.
Figure 3:
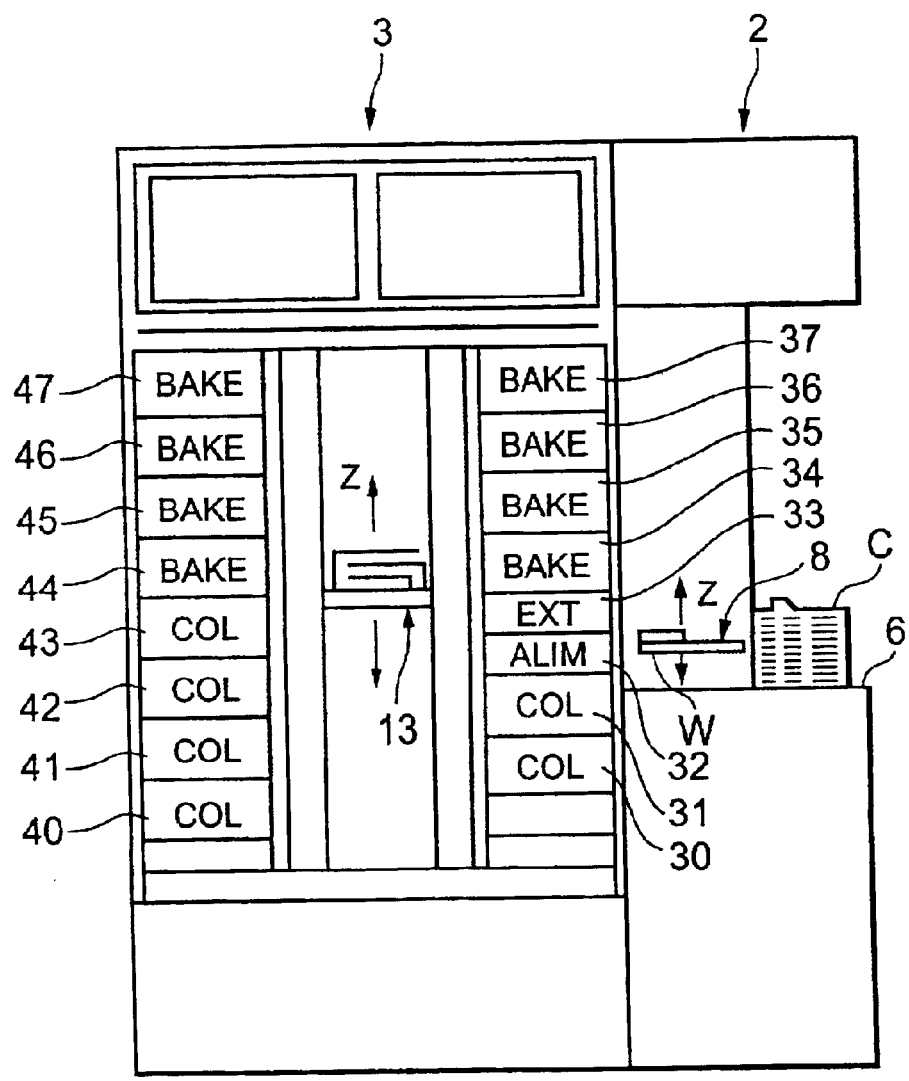
FIG. 3 is a rear view of the film forming system in FIG. 1.

A preferred embodiment of the present invention will be described below with reference to the attached drawings. As an example of a processing method according to the embodiment of the present invention, a film forming method for forming a layer insulating film on a wafer W as a substrate will be explained. FIG. 1 is a plan view of a film forming system 1 as an example of a processing apparatus according to the embodiment of the present invention, FIG. 2 is a front view of the film forming system 1 shown in FIG. 1, and FIG. 3 is a rear view of the film forming system 1 shown in FIG. 1.

As shown in FIG. 1, the film forming system 1 has structure in which a cassette station 2 for transferring, for example, 25 wafers W per cassette, as a unit, from/to the outside into/from the film forming system 1 and carrying the wafer W into/out of a cassette C, a processing station 3 in which various kinds of processing units each for performing predetermined processing for the wafers W one by one are multi-tiered are integrally connected.

In the cassette station 2, cassettes C can be freely mounted in a line in an X-direction (a vertical direction in FIG. 1) with respective transfer ports for the wafer W facing the processing station 3 side at predetermined positions on a cassette mounting table 6. A wafer transfer body 8 movable in the direction of arrangement of the cassettes (the X-direction) and in the direction of arrangement of the wafers W housed in the cassette C (a Z-direction; vertical direction) is movable along a transfer path 9 to be able to selectively get access to each of the cassettes C.

The wafer transfer body 8 is also structured to be rotatable in a θ-direction (the direction of rotation around a Z-axis) so as to be accessible to alignment unit 32 and an extension unit 33 included in a third processing unit group $G_3$ as will be described later.

In the processing station 3, a vertical transfer-type main transfer device 13 is provided in the middle thereof, and various kinds of processing units are multi-tiered to compose processing unit groups around the main transfer device 13. In the film forming system 1, four processing unit groups $G_1$, $G_2$, $G_3$, and $G_4$ can be arranged. The first and second processing unit groups $G_1$ and $G_2$ are arranged at the front of the film forming system 1, the third processing unit group $G_3$ is arranged adjacent to the cassette station 2, and the fourth processing unit group $G_4$ is arranged to face the third processing unit group $G_3$ with the main transfer device 13 between them. A fifth processing unit group $G_5$ shown by the broken line can be arranged at the back as required.

As shown in FIG. 2, in the first processing unit group $G_1$, a first film forming unit 20 (21) for performing adhesion promoter (ADP) processing for the wafer W is disposed at the upper tier. In the second processing unit group $G_2$, a second film forming unit 22 (23) having basically the same structure as the first film forming unit 20 (21) has, for performing coating processing for the wafer W is disposed at the upper tier.

In the third processing unit group $G_3$, units as temperature regulating mechanisms are disposed, and as shown in FIG. 3, oven-type processing units each for performing predetermined processing while the wafer W is placed on a mounting table, for example, cooling heat units 30 and 31 each for performing cooling processing, an alignment unit 32 for aligning the wafer W, an extension unit 33 for making the wafer W wait, baking units 34, 35, 36, and 37 each for performing heat processing, or the like are eight-tiered from the bottom in order.

In the fourth processing unit group $G_4$, cooling heat units 40, 41, 42, and 43, and baking units 44, 45, 46, and 47, or the like, for example, as temperature regulating mechanisms are eight-tiered from the bottom in order.

As will be described later, it is required to regulate the temperature of the wafer W before transferring the wafer W to the first film forming unit 20 (21) and before transferring the wafer W to the second film forming unit 22 (23). For example, the cooling heat units 40 and 41 located at the bottom tiers below the cooling heat units 42 and 43 regulate the temperature of the wafer W before the wafer W is transferred to the second film forming unit 22 (23), and the cooling units 42 and 43 regulate the temperature of the wafer W before the wafer W is transferred to the first film forming unit 20 (21). It is necessary to regulate the temperature of the wafer W before the wafer is transferred to the second film forming unit 22 (23) more precisely than before the wafer W is transferred to the first film forming unit 20 (21). The cooling heat units 40 and 41 placed below the cooling heat units 42 and 43 can yield more precise temperature control since they are more distant from the baking units 44, 45, 46, and 47 or the like.

Figure 4:
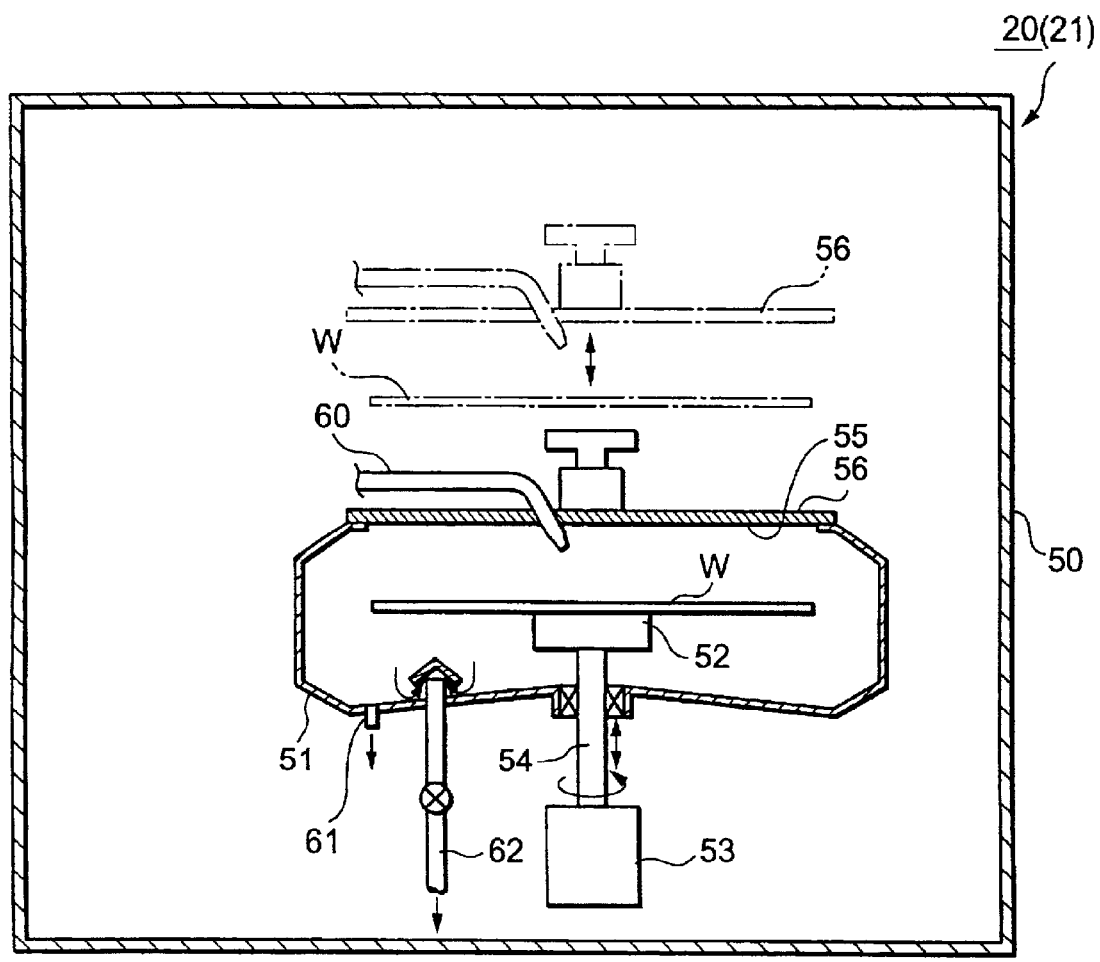
FIG. 4 is a sectioned explanatory view of a first film forming unit.

The structure of the first film forming unit 20 (21) will be explained. As shown in FIG. 4, a spin chuck 52 for vacuum-sucking the wafer W mounted thereon and rotatably supporting the wafer W is provided in a cup 51 placed in a casing 50. A rotating shaft 54 which can be raised and lowered and rotated by a drive section 53 is attached very close to the center of the lower face of the spin chuck 52. Thus, the spin chuck 52 can be raised and lowered between a delivery position of the wafer W above the cup 51 shown by the chain line in FIG. 4 and a processing position of the wafer W shown by the full line in FIG. 4, and can be rotated around a vertical shaft.

An opening 55 through which the wafer W can pass is formed in the upper face of the cup 51 so as to be opened and closed by a lid 56 provided to be ascendable and descendbale. An ADP solution supply nozzle 60 for supplying an ADP solution as a first processing solution is attached to the lid 56 almost exactly at the center of rotation above the wafer W. The temperature of the ADP solution supplied from the ADP solution supply nozzle 60 is previously regulated at a predetermined ADP solution temperature (a predetermined processing solution temperature) by a temperature regulating mechanism 120 shown in FIG. 5.

Figure 5:
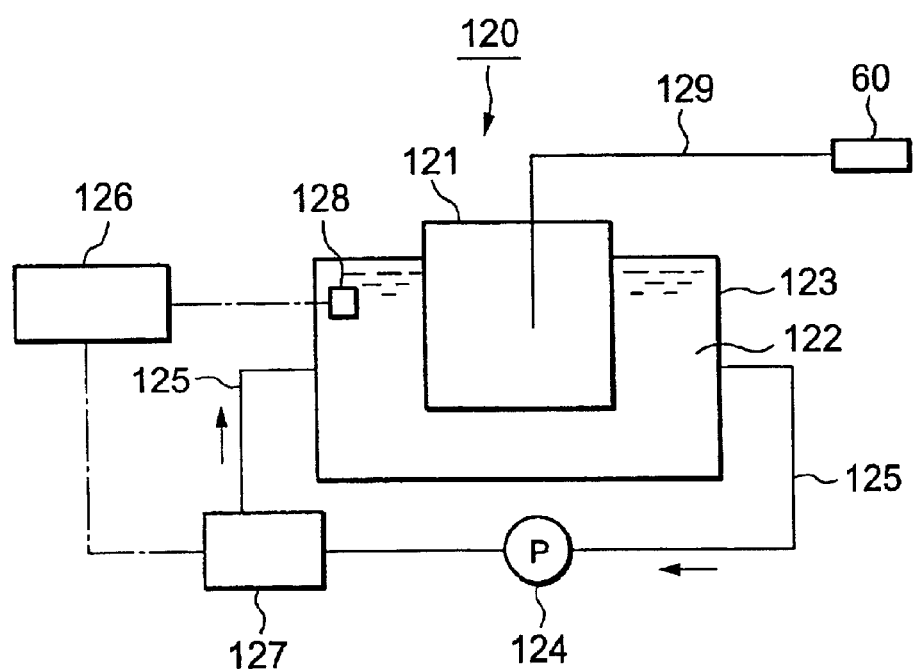
FIG. 5 is an explanatory view of a temperature regulating mechanism for an ADP solution.

More specifically, as shown in FIG. 5, a tank 121 storing the ADP solution is surrounded by a temperature regulated tank 123 filled with a heat medium 122. After flowing from within the temperature regulated tank 123 into a circulating circuit 125 temporarily, the heat medium 122 in the temperature regulated tank 123 is supplied again into the temperature regulated tank 123 while circulating. A temperature regulator 127 the operation of which is controlled by a control section 126 is provided in the circulating circuit 125. The temperature of the heat medium 122 in the temperature regulated tank 123 is detected by a sensor 128 and inputted to the control section 126. Thereby, the control section 126 is structured to control the operation of the temperature regulator 127 based on the temperature detected by the sensor 128 and to maintain the temperature of the heat medium 122 in the temperature regulated tank 123 at the predetermined ADP solution temperature. The aforesaid maintenance of the temperature of the heat medium 122 in the temperature regulated tank 123 at the predetermined ADP solution temperature allows the temperature of the ADP solution stored in the tank 121 to be regulated at the predetermined ADP solution temperature. Moreover, the ADP solution the temperature of which is regulated at the predetermined ADP solution temperature is discharged from the ADP solution supply nozzle 60 via a circuit 129.

As shown in FIG. 4, a tip portion of the ADP solution supply nozzle 60 is tilted downward to the center of rotation above the wafer W. The ADP solution performs the function of enhancing the adhesion of the coating solution and the wafer W which will be described later. A drainage pipe 61 for draining the ADP solution scattered from the wafer W and an exhaust pipe 62 for exhausting an atmosphere in the cup 51 are The structure of the second film forming unit 22 (23) will be explained base on FIG. 6. The basic structure thereof is the same as that of the first film forming unit 20 (21), and a point of difference between them is that a coating solution supply nozzle 65 for supplying a coating solution (a coating solution containing organic macromolecules and the like) as a second processing solution to the front surface of the wafer W in place of the ADP solution supply nozzle 60 is attached to the lid 56. The structure of the second film forming unit 22 (23) except for this point is the same as that of the first film forming unit 20 (21), and the same numerals and symbols will be used to designate the same components as those provided in the first film forming unit 20 (21) out of components of the second film forming unit 22 (23), so that the repetition of explanation will be omitted. It should be mentioned that the coating solution is a liquid which is a raw material for fonning a layer insulating film on the wafer W.

Figure 7:
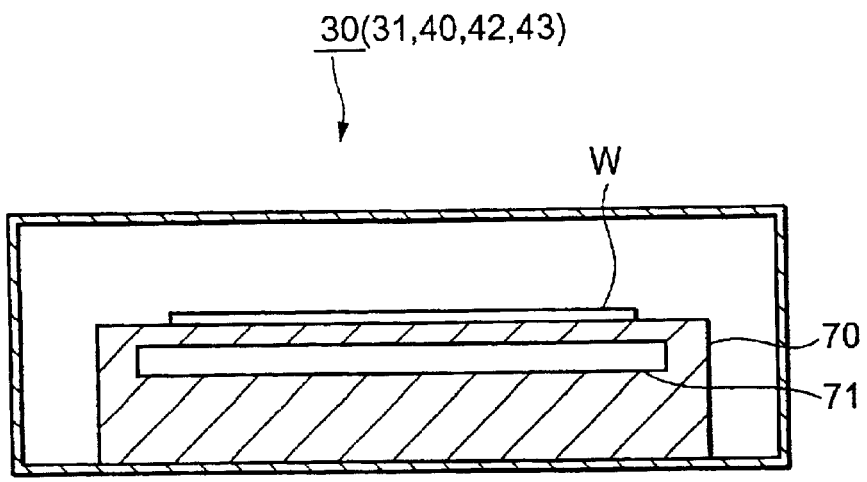
FIG. 7 is a sectioned explanatory view of a cooling heat unit.

Since the cooling heat units 30, 31, 40, 41, 42, and 43 all have the same structure, the cooling heat unit 30 will be explained to represent them. As shown in FIG. 7, a mounting table 70 is placed in the cooling heat unit 30. An electro-thermo device 71 is embedded in the mounting table 70 and connected to a power supply control section not illustrated, and the device 71 is used Peltier effect. The power supply control section passes an electric current through the electro-thermo device 71 and changes the current-passing direction thereof and the voltage when passing the electric current, thereby allowing the electro-thermo device 71 to heat and cool the wafer W mounted on the mounting table 70 to a desired temperature.

Figure 8:
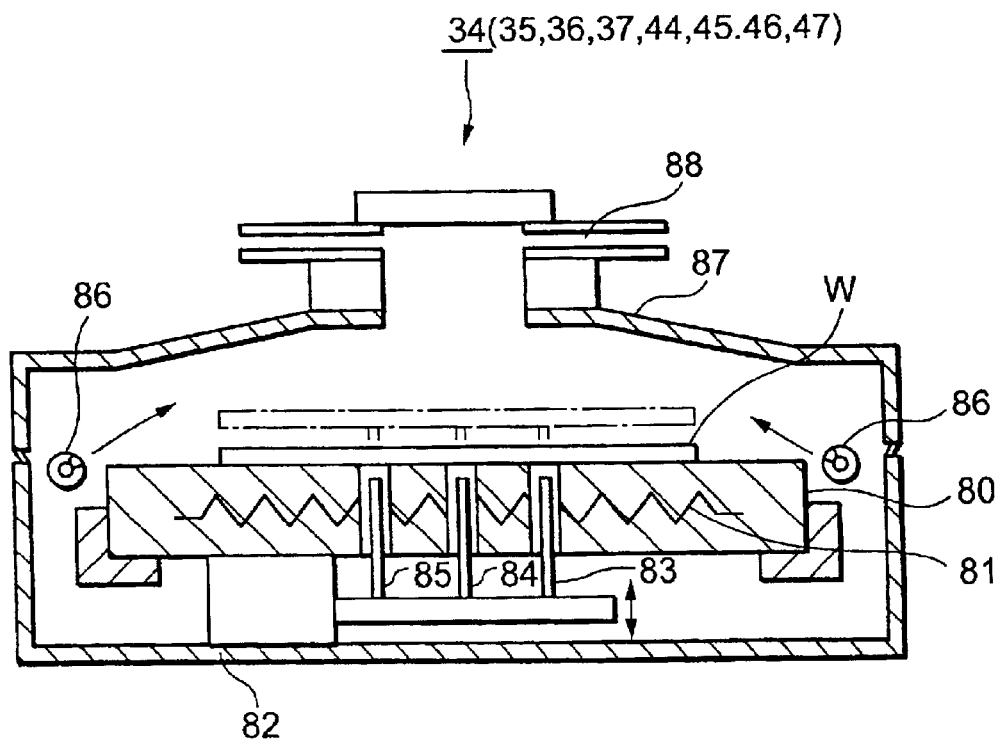
FIG. 8 is a sectioned explanatory view of a baking unit.

The structure of the baking units 34, 35, 36, 37, 44, 45, 46, and 47 will be explained with the baking unit 34 as an example. As shown in FIG. 8, a mounting table 80 is placed almost exactly in the middle of the baking unit 34. A hot wire 81, for example, is embedded in the mounting table 80 and connected to a power supply control section not illustrated. When the power supply control section sends an electric current into the hot wire 81, the hot wire 81 generates heat to thereby heat the wafer W mounted on the mounting table 80. Three supporting pins 83, 84, and 85 which can be raised and lowered by a raising and lowering mechanism 82 are disposed to be protrudable into and retractable from the mounting table 80. Thus, the supporting pins 83 to 85 can raise and lower the wafer W between a delivery position of the wafer W above the mounting table 80 shown by the chain line in FIG. 8 and a processing position of the wafer W shown by the full line in FIG. 8.

An $N_2$ gas jet pipe 86 for jetting an inert gas, for example, $N_2$ gas is disposed to surround the mounting table 80 around the mounting table 80. Above the mounting table 80, a lid body 87 is disposed to form an enclosed space between the mounting table 80 and itself. The lid body 87 can be raised and lowered by a raising and lowering mechanism not illustrated, and is tilted upward to the center. An exhaust port 88 is provided at the center of the lid body 87. The exhaust port 88 is connected to an exhaust system not illustrated such as a vacuum pump and the like.

Figure 9:
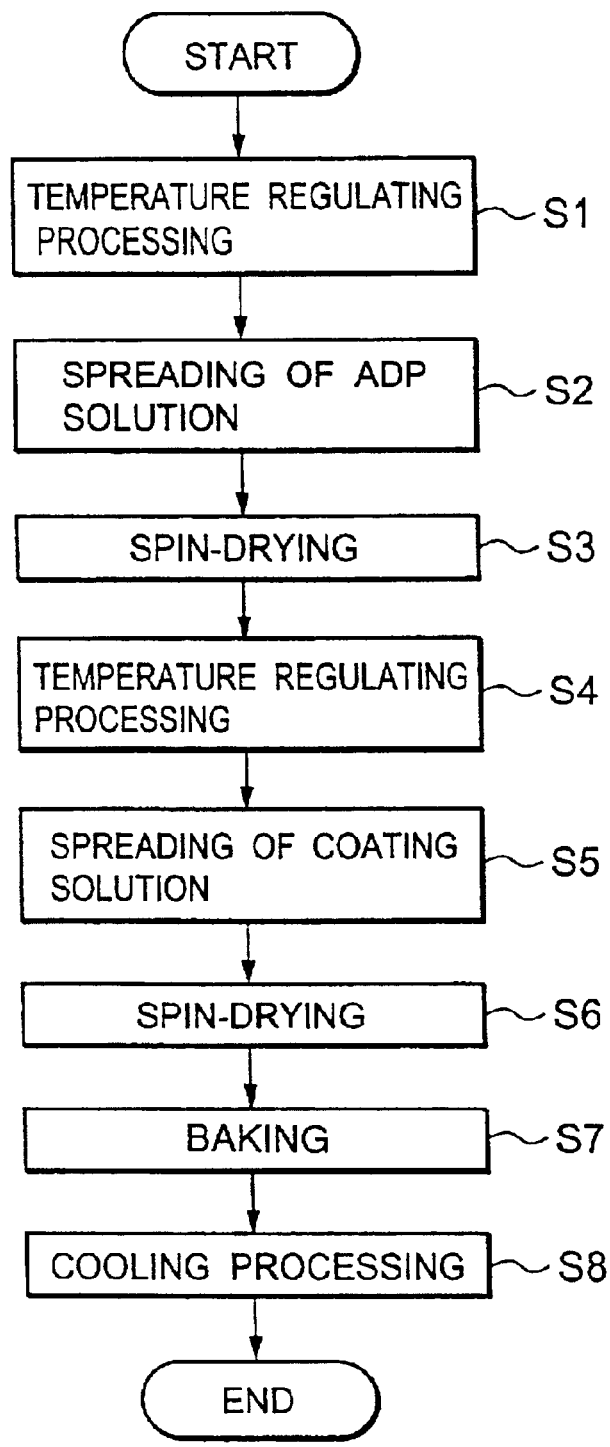
FIG. 9 is a flowchart showing a layer insulating film forming process.

A method of forming a layer insulating film put into practice by the film forming system 1 structured as above will be explained. FIG. 9 shows a flowchart of the layer insulating film forming method.

First, the unprocessed wafer W is carried into, for example, the cooling heat unit 40, and the front surface temperature of the wafer W is regulated at a predetermined temperature, for example, 35° C. (S1). Thereafter, the wafer W is carried into the first film forming unit 20 (21), vacuum-sucked by the spin chuck 52, and housed in the cup 51. Subsequently, the ADP solution the temperature of which is previously regulated at the predetermined ADP solution temperature by the temperature regulating mechanism 120 explained in FIG. 5 is supplied to the front surface of the wafer W from the ADP solution supply nozzle 60, and then the wafer W is rotated by the spin chuck 52. The ADP solution is spread over the entire front surface of the wafer W by centrifugal force due to the rotation of the wafer W (S2). Thereafter, the wafer W continues rotating to thereby be spin-dried (S3), and ADP processing is completed.

In the above case, the front surface temperature of the wafer w changes with the performance of ADP processing. Therefore, the wafer W is previously carried into, for example, the cooling heat unit 43 before the step of spreading a coating solution, and the front surface temperature of the wafer W is regulated at a predetermined substrate temperature (S4). Namely, when the temperature of the ADP solution supplied from the ADP solution supply nozzle 60 to the front surface of the wafer W in the previous step (the ADP solution temperature) is higher than the predetermined substrate temperature, the front surface temperature of the wafer W is higher than the predetermined substrate temperature, and hence in the cooling heat unit 43, the front surface temperature of the wafer W is regulated at the predetermined substrate temperature by passing an electric current in a current-passing direction in which the electro-thermo device 71 is cooled and cooling the wafer W mounted on the mounting table 70 by proper control of current-passing voltage by means of the power supply control section. Conversely, when the temperature of the ADP solution supplied from the ADP solution supply nozzle 60 to the front surface of the wafer W in the previous step (the ADP solution temperature) is lower than the predetermined substrate temperature, the front surface temperature of the wafer W is lower than the predetermined substrate temperature, and hence in the cooling heat unit 43, the front surface temperature of the wafer W is regulated at the predetermined substrate temperature by passing an electric current in a current-passing direction in which the electro-thermo device 71 is heated and heating the wafer W mounted on the mounting table 70 by proper control of current-passing voltage by means of the power supply control section.

Subsequently, the wafer W is carried into the second film forming unit 22 (23), and likewise with the first film forming unit 20 (21), the wafer W is vacuum-sucked by the spin chuck 52 and housed in the cup 51. Subsequently, the coating solution is supplied to the front surface of the wafer W from the coating solution supply nozzle 65, and then the wafer W is rotated by the spin chuck 52. The coating solution is spread over the entire front surface of the wafer W by centrifugal force due to the rotation of the wafer W (S5). In this case, since the front surface temperature of the wafer W is maintained at the predetermined substrate temperature, drying of the coating solution on the wafer W progresses moderately, and thus the coating solution spread on the peripheral edge portion of the wafer W becomes difficult to clear off through the rotation of the wafer W and consequently tends to remain on the front surface of the wafer W. As a result, the coating solution can be applied onto the wafer W uniformly. Besides, the coating solution can be spread smoothly and becomes difficult to clear off by controlling the front surface temperature of the wafer W as described above, thereby reducing the quantity of the coating solution to be used as compared with prior arts. After the coating solution is spread, the wafer W is spin-dried (S6), and coating processing is completed.

Thereafter, the wafer W is carried into the baking unit 34 filled with an $N_2$ atmosphere, for example, to undergo heat processing, for example, at a temperature of 310° C. (S7), and finally undergoes cooling processing (S8). According to the film forming method in accordance with this embodiment as described above, after the ADP solution on the front surface of the wafer W is spin-dried, the front surface temperature of the wafer W is regulated at the predetermined substrate temperature, whereby the following step of spreading the coating solution can be performed while the front surface temperature of the wafer W is maintained at the predetermined substrate temperature. As a result, a layer insulating film can be formed uniformly on the wafer W. Incidentally, the temperature regulating processing (S1) performed first can be omitted if not specially required.

Thus, according to the film forming method in accordance with the embodiment of the present invention, the coating solution can be spread uniformly over the front surface of the wafer W even in small quantities. Accordingly, even if the wafer W increases in size, the quantity of the coating solution to be used can be prevented from increasing, which makes it possible to fabricate high-quality semiconductor devices while saving resources.

In the embodiment explained above, the example in which the cooling heat unit is used when the temperature of the wafer W is regulated (when the wafer W is heated and when the wafer W is cooled) in the step (S1) of regulating the front surface temperature of the unprocessed wafer W at the predetermined temperature and the step (S4) of regulating the front surface temperature of the wafer W at the predetermined substrate temperature is explained. It is, however, possible to regulate the front surface temperature of the wafer W, for example, by carrying the wafer W into the cooling heat unit 30 to cool the wafer W when the wafer W is cooled, and by carrying the wafer W into the baking unit 34 to heat the wafer W when the wafer W is heated.

Figure 10:
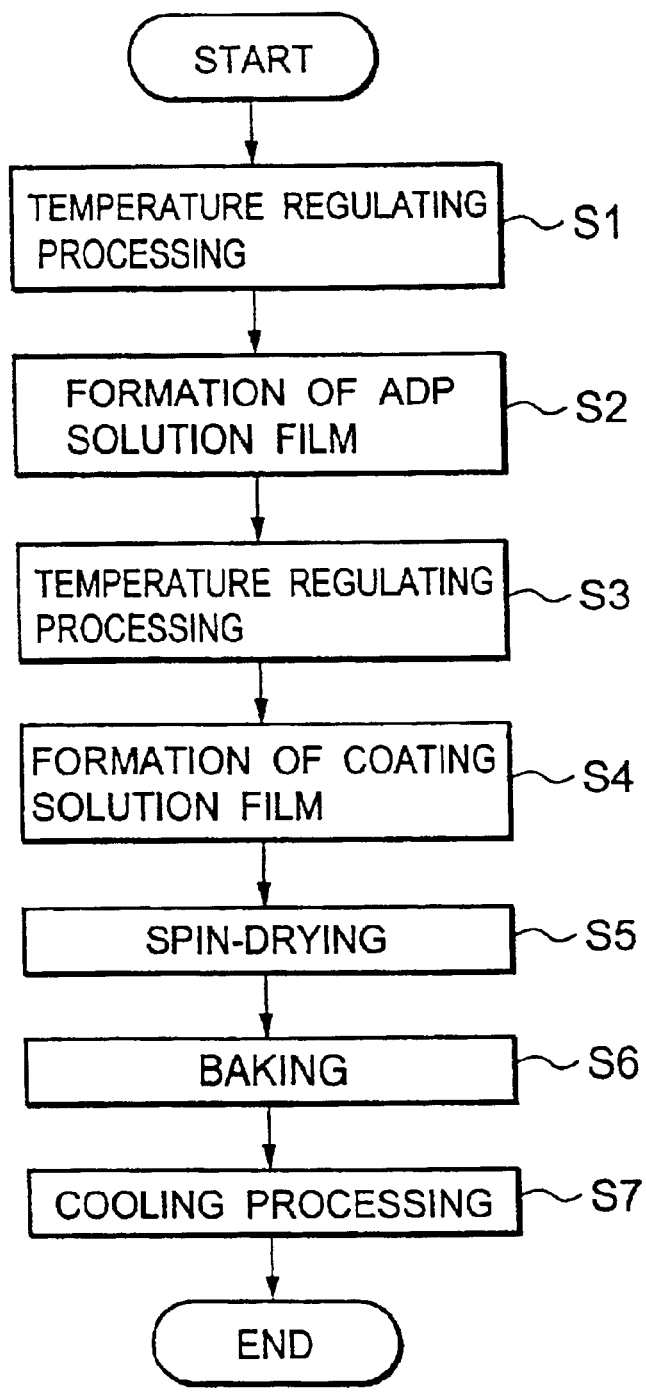
FIG. 10 is a flowchart showing a layer insulating film forming process in the case where temperature regulating processing is performed after an ADP solution film is formed.

Moreover, although spin-drying is performed after the ADP processing solution is spread in the embodiment explained above, the temperature regulating processing may be performed immediately after the ADP processing solution is spread without the spin-drying being performed. FIG. 10 shows a flowchart in this case. In the case shown in FIG. 10, the unprocessed wafer W is first carried into, for example, the cooling heat unit 30, and the front surface temperature of the wafer W is regulated at a predetermined temperature, for example, 35° C. (S1). Also in this case, similarly to the aforesaid case, it is suitable to cool the wafer W in the cooling heat unit 30 when the wafer W is cooled and to heat the wafer W in the baking unit 34 when the wafer W is heated.

Thereafter, the wafer W is carried into the first film forming unit 20 (21), vacuum-sucked by the spin chuck 52, and housed in the cup 51. The ADP solution is supplied from the ADP solution supply nozzle 60, and the wafer W is rotated by the spin chuck 52. The ADP solution is spread over the entire front surface of the wafer W by centrifugal force due to the rotation of the wafer W (S2). Thus, ADP processing is completed.

In this case, the front surface temperature of the wafer w changes with the performance of ADP processing. Therefore, the wafer W is previously carried into the cooling heat unit 30 before the step of spreading the coating solution to thereby be heated or cooled, and the front surface temperature of the wafer W is regulated at a predetermined substrate temperature (S3). Namely, when the front surface temperature of the wafer W is higher than the predetermined substrate temperature, the wafer W is cooled by the Peltier element 71, and conversely when the front surface temperature of the wafer W is lower than the predetermined substrate temperature, the wafer W is heated by the Peltier element 71. Thereby, the front surface temperature of the wafer W is regulated at the predetermined substrate temperature. Also in this case, likewise with the aforesaid case, it is suitable to cool the wafer W in the cooling heat unit 30 when the wafer W is cooled and to heat the wafer W in the baking unit 34 when the wafer W is heated.

Subsequently, the wafer W is carried into the second film forming unit 22 (23), and by performing the same process as in the first film forming unit 20 (21), the coating solution is spread over the wafer W (S4). After the coating solution is spread, the wafer W is spin-dried (S5), and coating processing is completed. Thereafter, the wafer W is carried into the baking unit 34 filled with the $N_2$ atmosphere, for example, to undergo heat processing, for example, at a temperature of 310° C. (S6), and finally undergoes cooling processing (S7). Thus, a layer insulating film is formed uniformly on the wafer W. Incidentally, the temperature regulating processing (S1) performed first can be omitted if not specially required.

Thus, according to the film forming method in accordance with this embodiment, the coating solution can be spread uniformly over the front surface of the wafer W even in small quantities. Accordingly, even if the wafer W increases in size, the quantity of the coating solution to be used can be prevented from increasing, which makes it possible to fabricate high-quality semiconductor devices while saving resources. Furthermore, if the front surface temperature of the wafer W is regulated at the predetermined temperature and in addition the temperature of the coating solution is regulated at the predetermined temperature, the spreading uniformity of the coating solution can be further improved.

Figure 11:
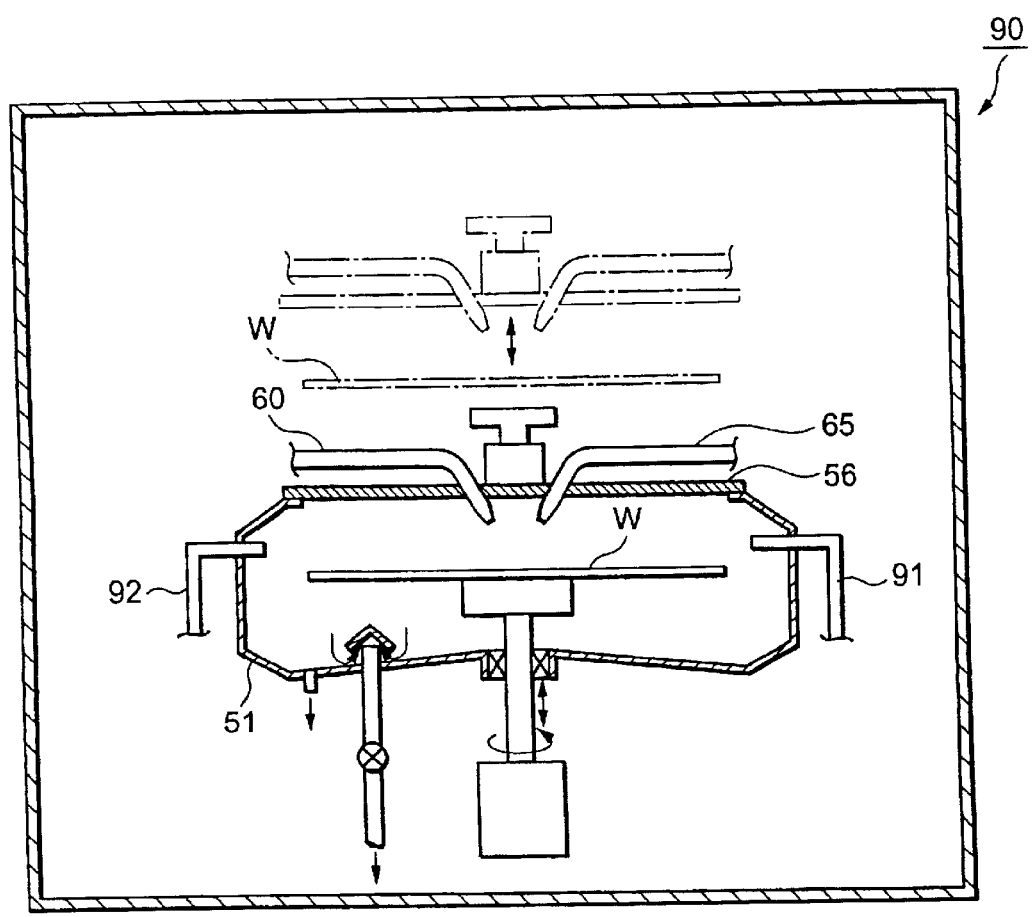
FIG. 11 is a sectioned explanatory view of a film forming unit including an ADP solution supply nozzle and a coating solution supply nozzle.

Moreover, in terms of the saving of installation space and the like, it is suitable to structure an apparatus capable of supplying both the ADP solution and the coating solution to the wafer W. A film forming unit 90 shown in FIG. 11 is an example thereof. In the film forming unit 90, the ADP solution supply nozzle 60 and the coating solution supply nozzle 65 are attached to the lid 56. $N_2$ gas supply pipes 91 and 92 each for supplying $N_2$ gas into the cup 51 are connected to a side wall portion of the cup 51. The structure of the film forming unit 90 except for these points is the same as that of the first film forming unit 20 (21) explained above by means of FIG. 4, and the same numerals and symbols will be used to designate the same components as those provided in the first film forming unit 20 (21) out of components of the film forming unit 90, so that the repetition of explanation will be omitted.

According to the film forming unit 90, after coating, spreading, and spin-drying of the ADP solution, the wafer W is temporarily carried out. While the temperature of the wafer W is regulated in the cooling heat unit or the baking unit, $N_2$ purge is performed in the cup 51. Thereby, the following step of applying and spreading a coating solution can be performed while the atmosphere of the ADP solution does not remain in the cup 51.

Figure 12:
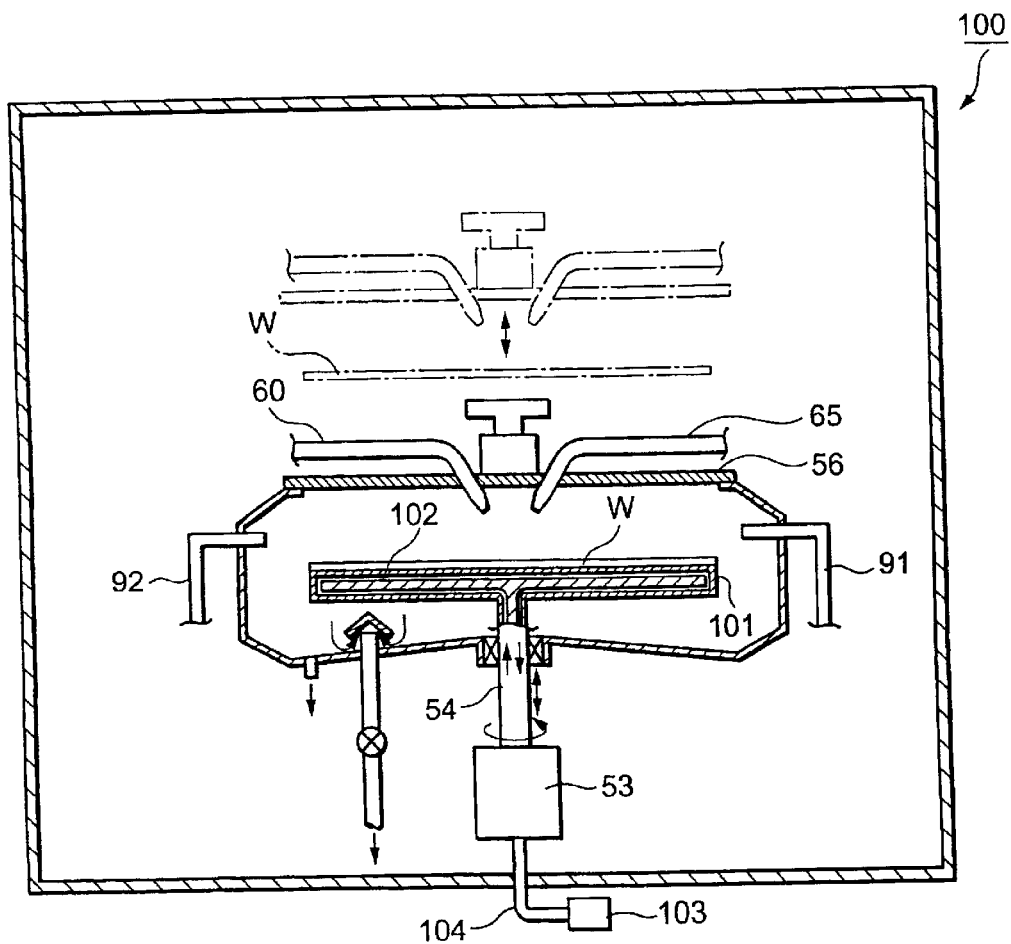
FIG. 12 is a sectioned explanatory view of a film forming unit including the ADP solution supply nozzle and the coating solution supply nozzle, in which a temperature regulating function is added to a spin chuck.

As shown in FIG. 12, a function capable of regulating the front surface temperature of the wafer W at the predetermined temperature can be added to a film forming unit 100. In the film forming unit 100 according to this embodiment, both the ADP solution supply nozzle 60 and the coating solution supply nozzle 65 are provided in the lid 56. In addition, a channel 102 for circulating temperature-regulated water as a heat medium is formed in a spin chuck 101. The temperature-regulated water the temperature of which is regulated at the predetermined substrate temperature by a temperature-regulated water supply device 103 is supplied to the channel 102 while circulating through the rotating shaft 43 of the drive section 64 via a double pipe 104. The structure of the film forming unit 100 except for this point is the same as that of the first film forming unit 20 (21) explained as above by means of FIG. 4, and the same numerals and symbols will be used to designate the same components as those provided in the first film forming unit 20 (21) out of components of the film forming unit 100, so that the repetition of explanation will be omitted.

According to the film forming unit 100, the wafer W remains vacuum-sucked by the spin chuck 101 after ADP processing is performed. The temperature-regulated water is circulated in the channel 102 to thereby regulate the front surface temperature of the wafer W at the predetermined substrate temperature, and $N_2$ purge is performed by both the $N_2$ gas supply pipes 91 and 92 to exchange the atmosphere in the cup 51 for $N_2$ atmosphere. Then, the step of applying and spreading the coating solution is performed. In the film forming unit 100, processing from ADP processing to spreading processing of the coating solution can be performed continuously as described above, which makes it possible to save time and labor required for carrying the wafer W in and out as compared with the film forming unit 90 and the like explained before, leading to improvement in through-put.

Figure 13:
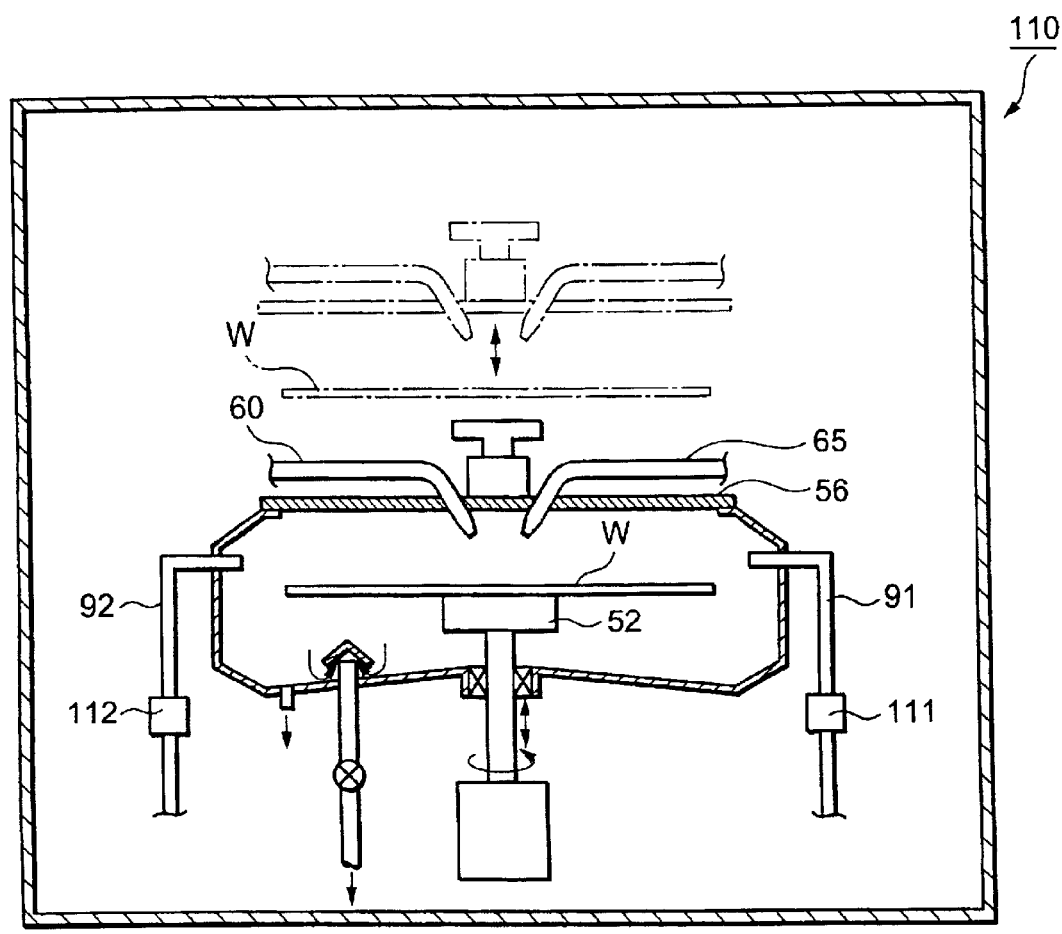
FIG. 13 is a sectioned explanatory view of a film forming unit including the ADP solution supply nozzle and the coating solution supply nozzle, in which temperature regulating elements are further provided midway in $N_2$ gas supply pipes.

As shown in FIG. 13, a film forming unit 110 is provided with a gas supply mechanism for blowing gas with the predetermined substrate temperature against a substrate instead of giving a temperature regulating function to the spin shuck 52. Namely, the $N_2$ gas supply pipe 91 is provided with a temperature regulating element 111, and the $N_2$ gas supply pipe 92 is provided with a temperature regulating element 112. According to such structure, before $N_2$ gas is supplied into the cup 51, the temperature of the $N_2$ gas is regulated at the predetermined substrate temperature by the temperature regulating elements 111 and 112. The cup 51 is filled with such $N_2$ gas with the predetermined substrate temperature, whereby the front surface temperature of the wafer W can be regulated at the predetermined substrate temperature. It is needless to say that throughput can be improved likewise with the film forming unit 100.

Figure 17:
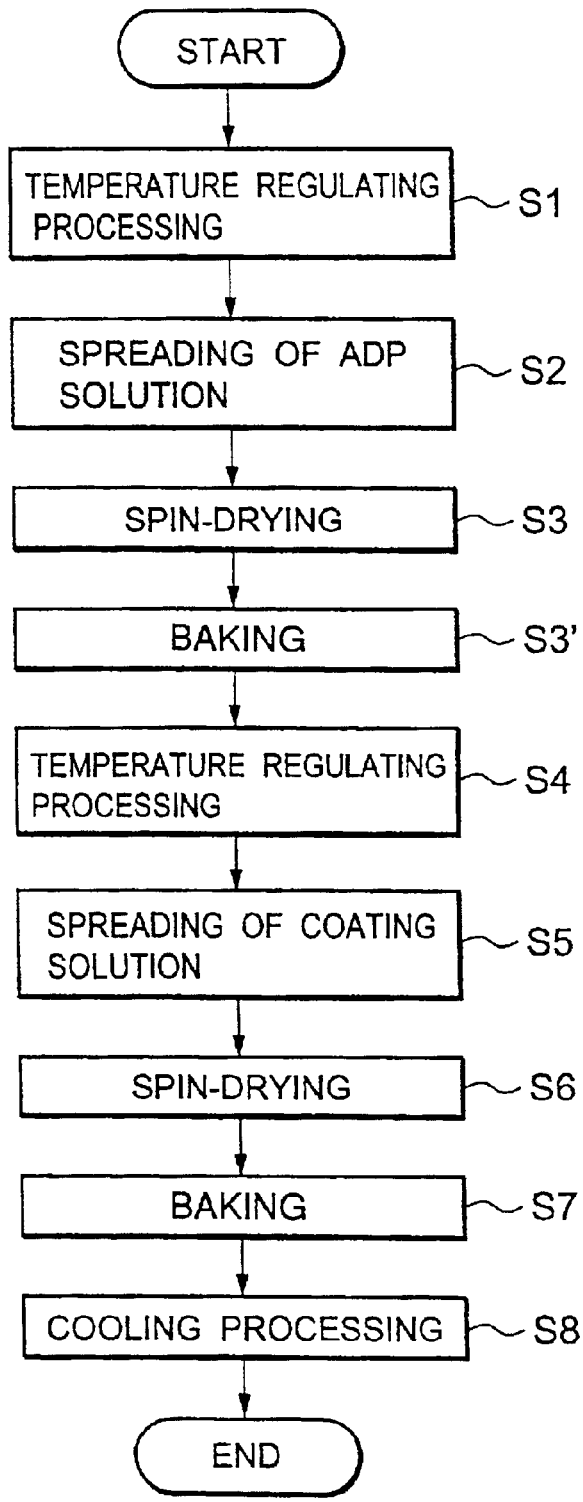
FIG. 17 is a flowchart showing a layer insulating film forming process according to another embodiment of the present invention.

Although the temperature regulating processing (S4) is performed immediately after the spin-drying (S3) as shown in FIG. 9 in the aforesaid embodiment, heat processing (S3') at temperatures approximately in the range of 100° C. to 200° C. may be performed in the baking unit between the step of spin-drying (S3) and the step of temperature regulating processing (S4) as shown in FIG. 17. As a result, adhesion of the coating film can be further enhanced.

Figure 6:
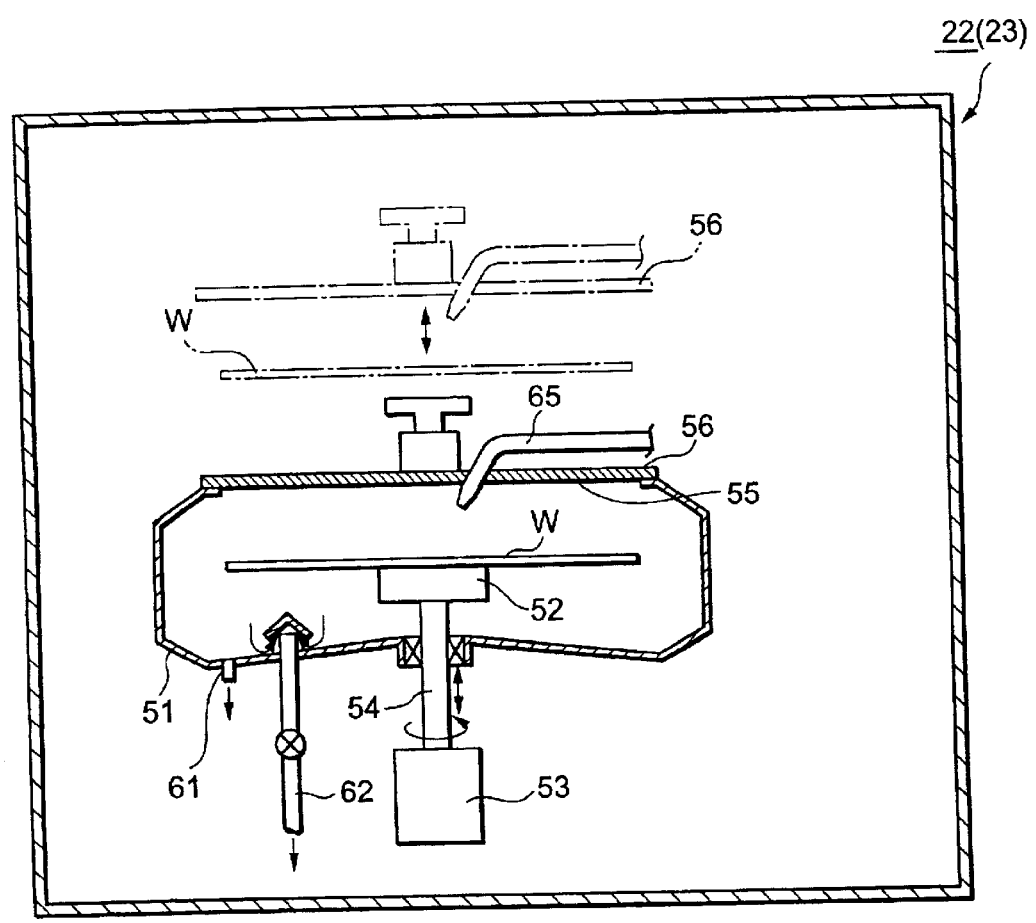
FIG. 6 is a sectioned explanatory view of a second film forming unit.
Figure 18:
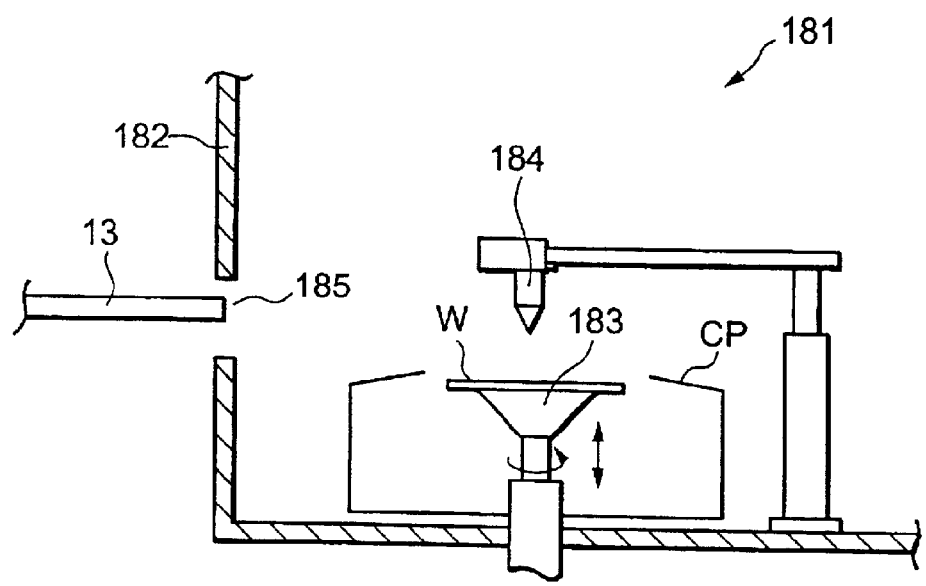
FIG. 18 is a schematic view of a film forming unit according to still another embodiment of the present invention.

Moreover, although the unit is structured so that the processing solution is supplied to the wafer W in the enclosed space in the film forming unit as shown in FIG. 4 and FIG. 6, it is of course suitable to use an oven-type film forming unit as shown in FIG. 18. In a film forming unit 181 shown in FIG. 18, a cup CP is disposed almost exactly in the middle of a unit main body 182. A spin chuck 183 for rotatably holding the wafer W is disposed in the cup CP, and a movable nozzle 184 for supplying a processing solution is disposed above the spin chuck 183. An opening 185 for receiving and sending the wafer W from/to the main transfer device 13 is provided in a face opposite to the main transfer device 13 of the unit main body 182. The spin chuck 183 can be rotated by a motor of which the illustration is omitted and can be raised and lowered by a raising and lowering mechanism.

It should be mentioned that a substrate is not limited to the wafer W in the aforesaid embodiments, and that other substrates such as an LCD substrate, a CD substrate, and the like are also suitable.

Next, experiments of the present invention are performed. The film forming system explained in FIG. 1 to FIG. 7 is prepared, and a coating solution film is formed on the wafer. The relationship between the front-surface temperature of the wafer and the uniformity of the coating solution film is examined. In this case, both a conventional film forming method and the film forming method of the present invention are put into practice, and the results thereof are compared. An object of experiments is a wafer with a diameter of 200 millimeters, the components of the ADP solution contain propylene glycol monomethyl ether (PGME) and propylene glycol methyl ether acetate (PMA) PGME and PMA, and the components of the coating solution contain cyclohexane.

Figure 14:
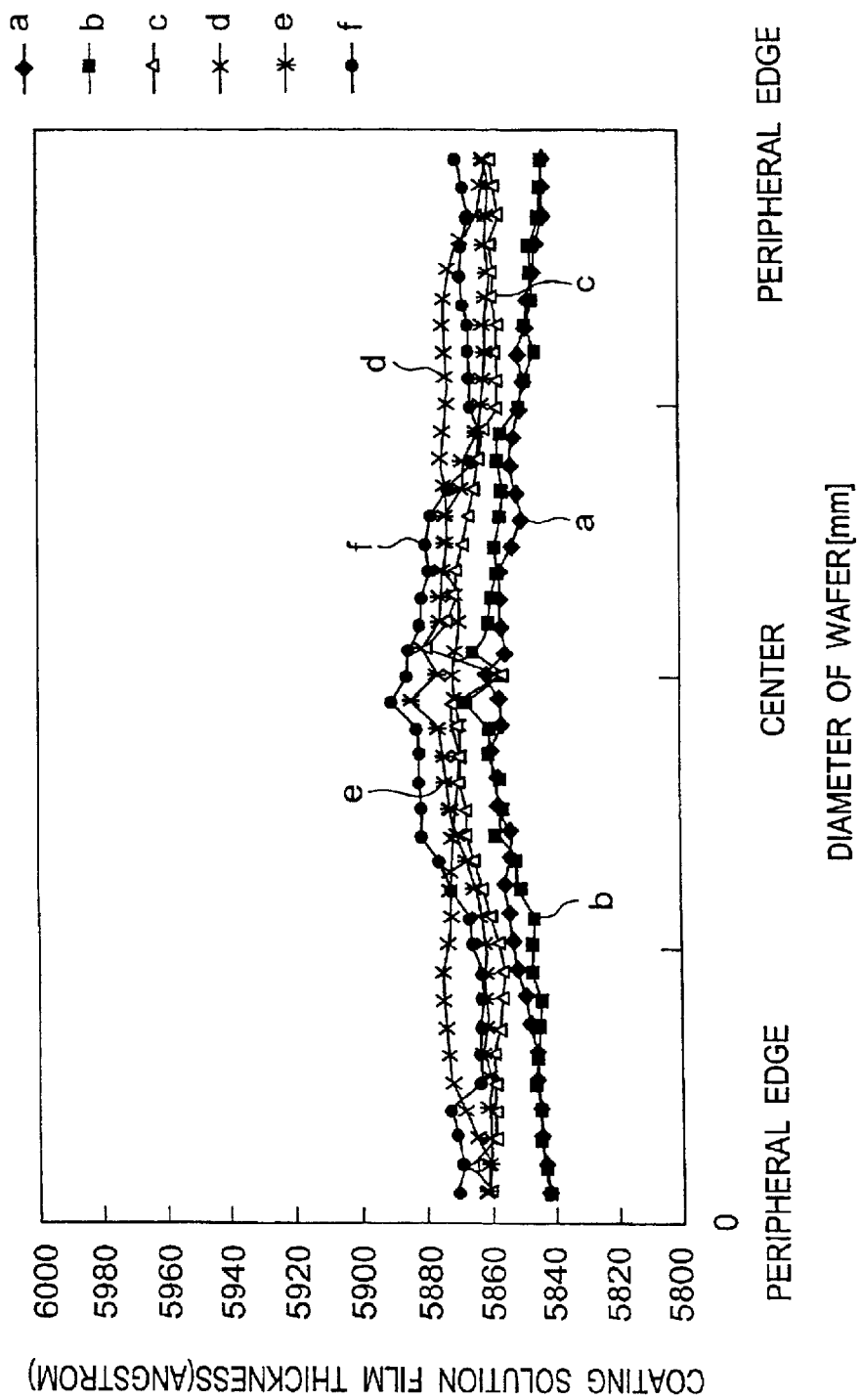
FIG. 14 is a graph showing the relationship between the front surface temperature of a wafer and the profile of a coating solution film in the case where the coating solution film is formed on the wafer by a conventional film forming method.
Figure 15:
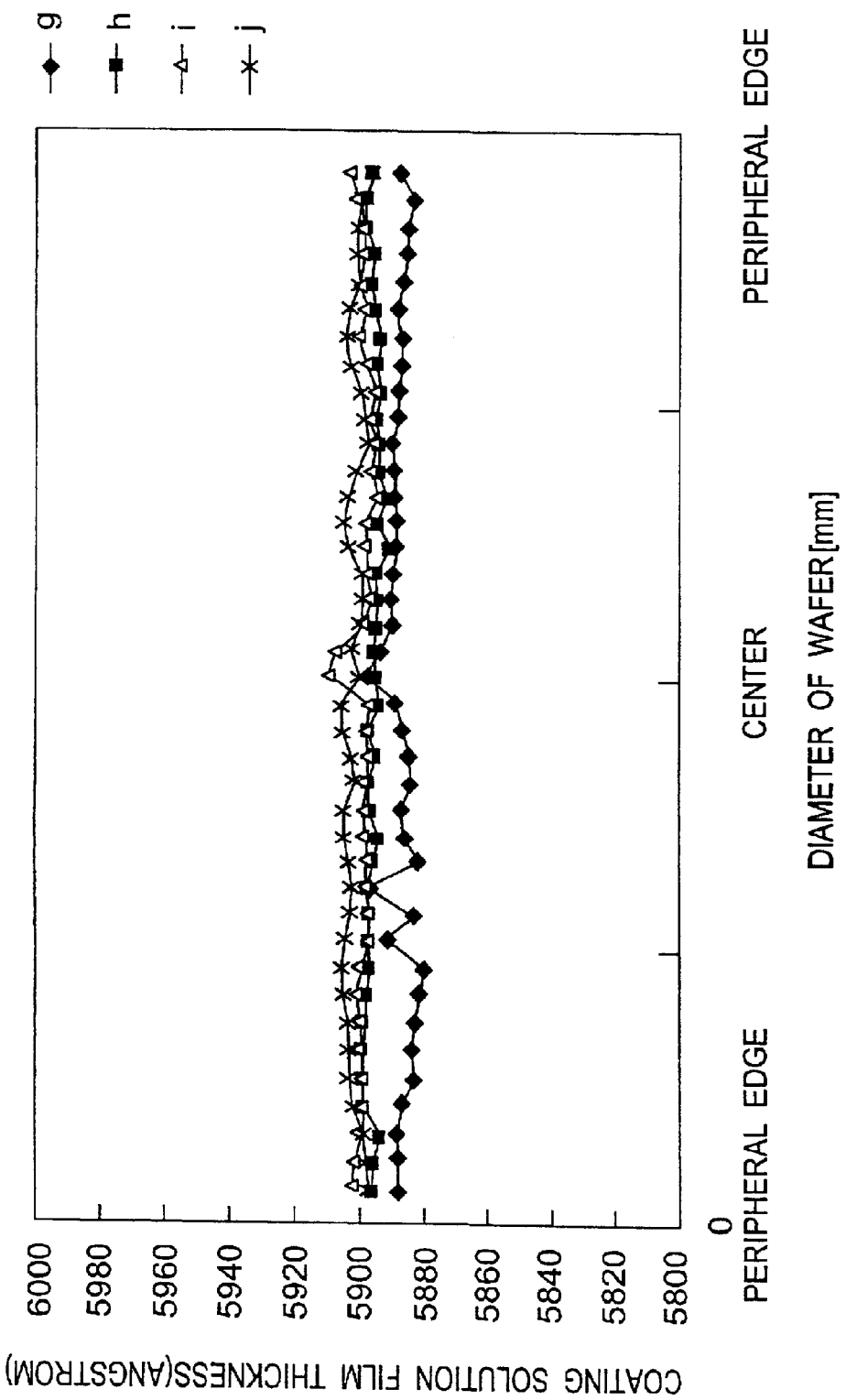
FIG. 15 is a graph showing the relationship between the front surface temperature of a wafer and the profile of a coating solution film in the case where the coating solution film is formed on the wafer by the film forming method according to the embodiment of the present invention.

In the case where the coating solution film is formed on the wafer by the conventional film forming method, ADP processing and coating processing are performed continuously after the front surface temperature of the wafer W is regulated at the predetermined temperature. The results thereof are shown in FIG. 14. In the case where the coating solution film is formed on the wafer by the film forming method of the present invention, ADP processing is performed after the front surface temperature of the wafer is regulated at the predetermined temperature, and thereafter the front surface temperature of the wafer is again regulated at the predetermined temperature and coating processing is then performed. The results thereof are shown in FIG. 15. In both the cases, the ADP solution film is formed by the use of about 2 cc of ADP solution, and the coating solution film is formed by the use of about 2 cc of coating solution.

In FIG. 14 and FIG. 15, the vertical axis is the thickness of the coating solution film (unit: an angstrom), the horizontal axis is the diameter of the wafer, and graphic lines shown in FIG. 14 and FIG. 15 show the situation of changes in the thickness of the coating solution film on the wafer (the profile of the coating solution film). In FIG. 14, the graphic line a shows the profile of the coating solution film when the predetermined temperature is 19° C., the graphic line b shows the profile of the coating solution film when the predetermined temperature is 23° C., the graphic line c shows the profile of the coating solution film when the predetermined temperature is 25° C., the graphic line d shows the profile of the coating solution film when the predetermined temperature is 27° C., the graphic line e shows the profile of the coating solution film when the predetermined temperature is 29° C., and the graphic line f shows the profile of the coating solution film when the predetermined temperature is 33° C. In FIG. 15, the graphic line g shows the profile of the coating solution film when the predetermined temperature is 19° C., the graphic line h shows the profile of the coating solution film when the predetermined temperature is 21° C., the graphic line i shows the profile of the coating solution film when the predetermined temperature is 23° C., and the graphic line j shows the profile of the coating solution film when the predetermined temperature is 25° C.

As can be seen from FIG. 14 and FIG. 15, the formation of the coating solution film on the wafer by the film forming method of the present invention enables the profile of the coating solution film to be flattened more than by the conventional film forming method. Consequently, the coating solution film more uniform than by the conventional method can be formed on the wafer. Moreover, as can be seen from the comparison of the graphic lines a, b, c, d, e, and f in FIG. 14 and the comparison of the graphic lines g, h, i, and j in FIG. 15, the profile of the coating solution film becomes flatter as the predetermined temperature rises. This is because the front surface temperature of the wafer approaches a temperature at which the coating solution is moderately dried. Incidentally, although FIG. 15 shows only graphic lines up to the graphic line j showing the profile of the coating solution film when the predetermined temperature is 25° C., the profile of the coating solution film is expected to be more flattened if data of the profile of the coating solution film are taken when the predetermined temperature exceeds 25° C., for example, when the predetermined temperature is 35° C.

Figure 16:
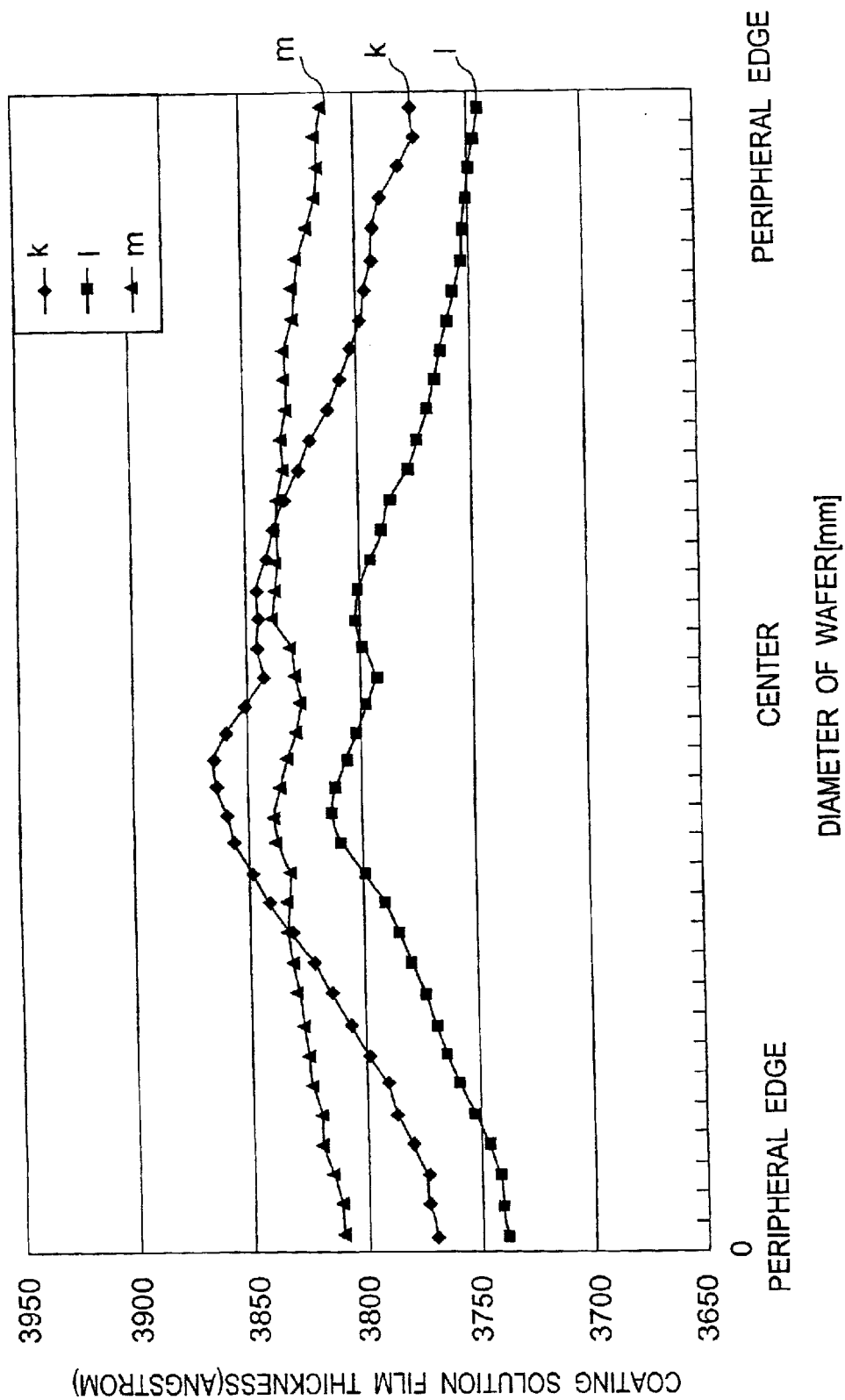
FIG. 16 is a graph showing the relationship between the front surface temperature of a wafer and the profile of a coating solution film in forming the coating solution film on the wafer by the use of about 0.5 cc of coating solution in the case where the coating solution film is formed on the wafer by the film forming method according to the embodiment of the present invention.

Furthermore, in the case where the coating solution film is formed on the wafer by the film forming method of the present invention, the profile of the coating solution film when the coating solution film is formed on the wafer W by the use of about 0.5 cc of coating solution. The results thereof are shown in FIG. 16. In FIG. 16, the graphic line k shows the profile of the coating solution film when the predetermined temperature is 23° C., the graphic line l shows the profile thereof when the predetermined temperature is 25° C., and the graphic line m shows the profile thereof when the predetermined temperature is 30° C. In the graphic lines k, l, and m in FIG. 16, similarly to FIG. 14 and FIG. 15, it is seen that the profile of the coating solution film becomes flatter as the predetermined temperature rises. Thus, a thin film of the coating solution can be formed uniformly on the wafer W by the use of a small quantity of coating solution, if the front surface temperature of the wafer is regulated at about 30° C. Incidentally, if the temperature of the coating solution is regulated at the predetermined temperature in addition to regulating the front surface temperature of the wafer at the predetermined temperature, it is expected that the uniformity of the coating solution film is further improved.

As explained above, according to the present invention, a film of the second processing solution can be formed on a substrate by the use of a small quantity of second processing solution. Accordingly, even if the substrate increases in size, the quantity of the second processing solution to be used can be prevented from increasing, which makes it possible to fabricate high-quality substrates while saving resources, and moreover, to save installation space and improve throughput.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate processing method for forming a layer insulating film on a semiconductor substrate by spin coating, comprising steps of:

(a) regulating the temperature of the substrate to a predetermined substrate temperature TS;

(b) regulating the temperature of an adhesion promoter solution serving as a first processing solution to a predetermined processing solution temperature TL;

(c) bringing the substrate into a cup and holding the substrate substantially horizontally on a spin chuck with a front surface of the substrate facing up;

(d) cooling the substrate when the processing solution temperature TL is higher than the substrate temperature TS, and heating the substrate in an inert atmosphere when the processing solution temperature TL is lower than the substrate temperature TS;

(e) while rotating the substrate by the spin chuck, supplying the first processing solution onto the front surface of the substrate and spreading the first processing solution over the front surface of the substrate by action of centrifugal force, thereby adhesion-promoting the front surface of the substrate with the first processing solution;

(f) removing the first processing solution from the substrate by further rotating the substrate by the spin chuck, thereby drying the front surface of the substrate; and (g) while supplying a film forming solution serving as a second processing solution onto the front surface of the substrate, rotating the substrate by the spin chuck and spreading the second processing solution over the front surface by action of centrifugal force, thereby forming a layer insulating film, wherein the steps (d) to (g) are continuously performed in the cup of step (c).

* * * * *